(12) United States Patent
Simon et al.

(10) Patent No.: US 6,498,512 B2
(45) Date of Patent: Dec. 24, 2002

(54) CLOCK RESHAPING

(75) Inventors: Thomas D. Simon, Marlborough, MA (US); Rajeevan Amirtharajah, Providence, RI (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/796,572

(22) Filed: Feb. 27, 2001

(65) Prior Publication Data

US 2002/0118036 A1 Aug. 29, 2002

(51) Int. Cl.$^7$ ............................................. H03K 5/159
(52) U.S. Cl. .................................. 326/93; 326/29
(58) Field of Search .......................... 326/93, 96, 29, 326/31, 32

(56) References Cited

U.S. PATENT DOCUMENTS 5,180,937 A * 1/1993 Laird et al. ............... 326/93
5,455,530 A   10/1995 Huppenthal et al. ....... 327/175
5,920,704 A * 7/1999 Olnowich et al. ...... 395/200.68
5,923,621 A   7/1999 Kanekal et al. ........... 368/117
6,060,922 A   5/2000 Chow et al. ............... 327/175
6,160,754 A   12/2000 Suh ........................... 365/233

* cited by examiner

Primary Examiner—Don Phu Le
(74) Attorney, Agent, or Firm—Fish & Richardson P.C.

(57) ABSTRACT

An apparatus includes a clock generator configured to generate a series of new clock pulses, the clock generator having an input port for receiving input clock pulses, an output port for delivering the new clock pulses to a target circuit that uses the new clock pulses to determine at least a start time or a stop time of a signal generated by the target circuit, and, a pulse delay for governing the width of the new clock pulses, the delay including circuits that produces longer delays for faster corners.

35 Claims, 17 Drawing Sheets

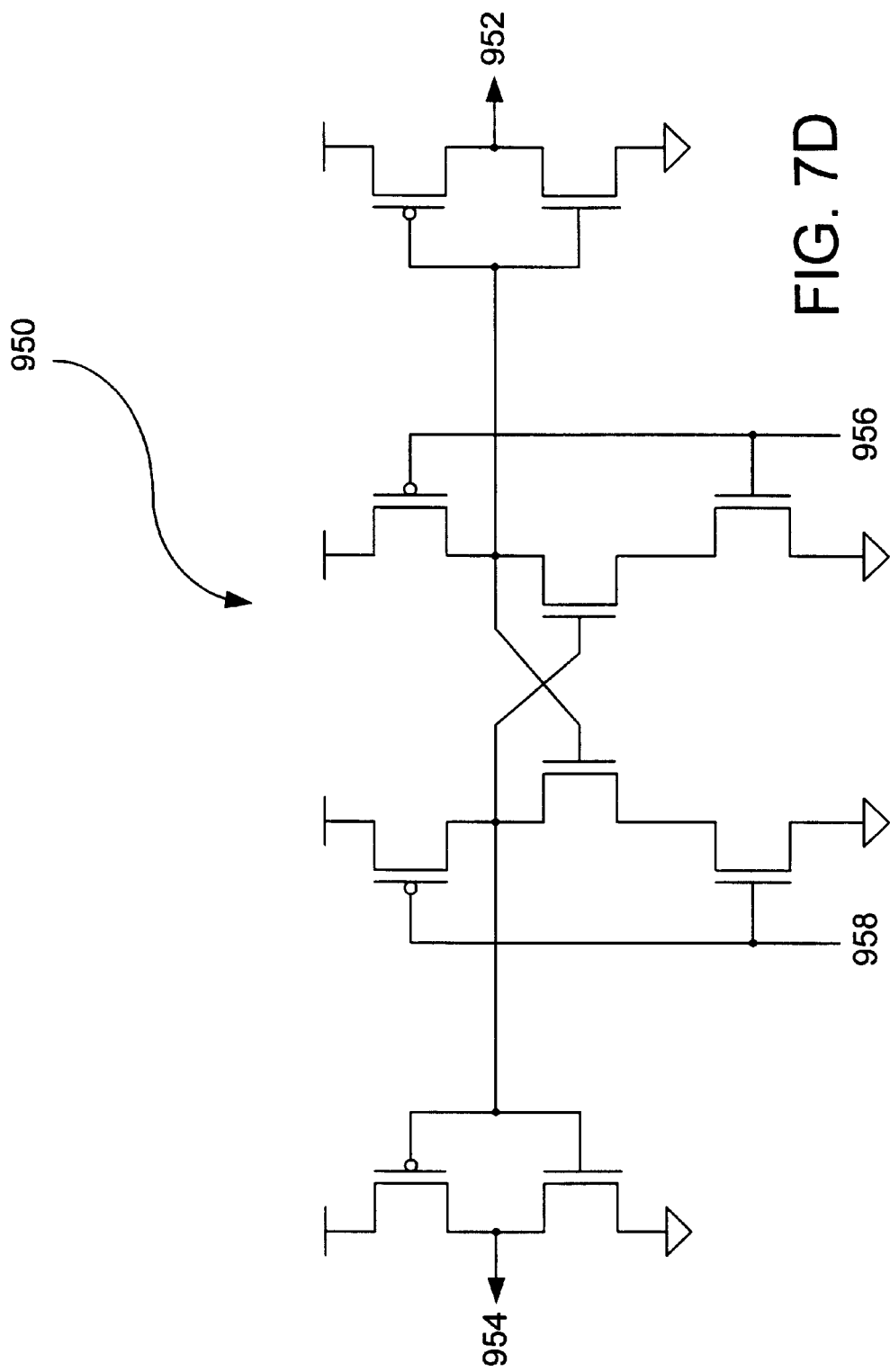

CLOCK RESHAPING

BACKGROUND OF THE INVENTION

This invention relates to clock reshaping.

Digital electronics systems, such as computers, must move data among their component devices at increasing rates to take full advantage of the higher speeds at which these component devices operate. For example, a computer may include one or more processors that operate at frequencies of a gigahertz (GHz) or more. The data throughput of these processors outstrips the data delivery bandwidth of conventional systems by significant margins.

The digital bandwidth (BW) of a communication channel may be represented as:

$$BW = F_s N_s.$$

Here, $F_s$ is the frequency at which symbols are transmitted on a channel and $N_s$ is the number of bits transmitted per symbol per clock cycle ("symbol density"). Channel refers to a basic unit of communication, for example a board trace in single ended signaling or the two complementary traces in differential signaling.

Conventional strategies for improving BW have focused on increasing one or both of the parameters $F_s$ and $N_s$. However, these parameters cannot be increased without limit. For example, a bus trace behaves like a transmission line for frequencies at which the signal wavelength becomes comparable to the bus dimensions. In this high frequency regime, the electrical properties of the bus must be carefully managed. This is particularly true in standard multi-drop bus systems, which include three or more devices that are electrically connected to each bus trace through parallel stubs.

Practical BW limits are also created by interactions between the BW parameters, particularly at high frequencies. For example, the greater self-induced noise associated with high frequency signaling limits the reliability with which signals can be resolved. This limits the opportunity for employing higher symbol densities.

Modulation techniques have been employed in some digital systems to encode multiple bits in each transmitted symbol, thereby increasing $N_s$. Use of these techniques has been largely limited to point-to-point communication systems, particularly at high signaling frequencies. Because of their higher data densities, encoded symbols can be reliably resolved only in relatively low noise environments. Transmission line effects limit the use of modulation in high frequency communications, especially in multi-drop environments.

The shape of clock pulses used to control the modulation of a transmitted symbol by a modulator circuit may have to be carefully controlled.

BRIEF DESCRIPTION OF THE DRAWINGS

The present invention may be understood with reference to the following drawings, in which like elements are indicated by like numbers. These drawings are provided to illustrate selected embodiments of the present invention and are not intended to limit the scope of the invention.

FIGS. 6A–6E represent signals at various stages of data transmission of the bus system of FIG. 1.

FIGS. 7A–7E are circuit diagrams for various components of the receiver of FIG. 4.

DETAILED DESCRIPTION OF THE INVENTION

Before discussing details of clock reshaping, we describe an example of a context in which the clock reshaping is useful: generating clock pulses for use in modulation circuitry used to modulate symbols to be transmitted in a high bandwidth communication system.

Figure 1:
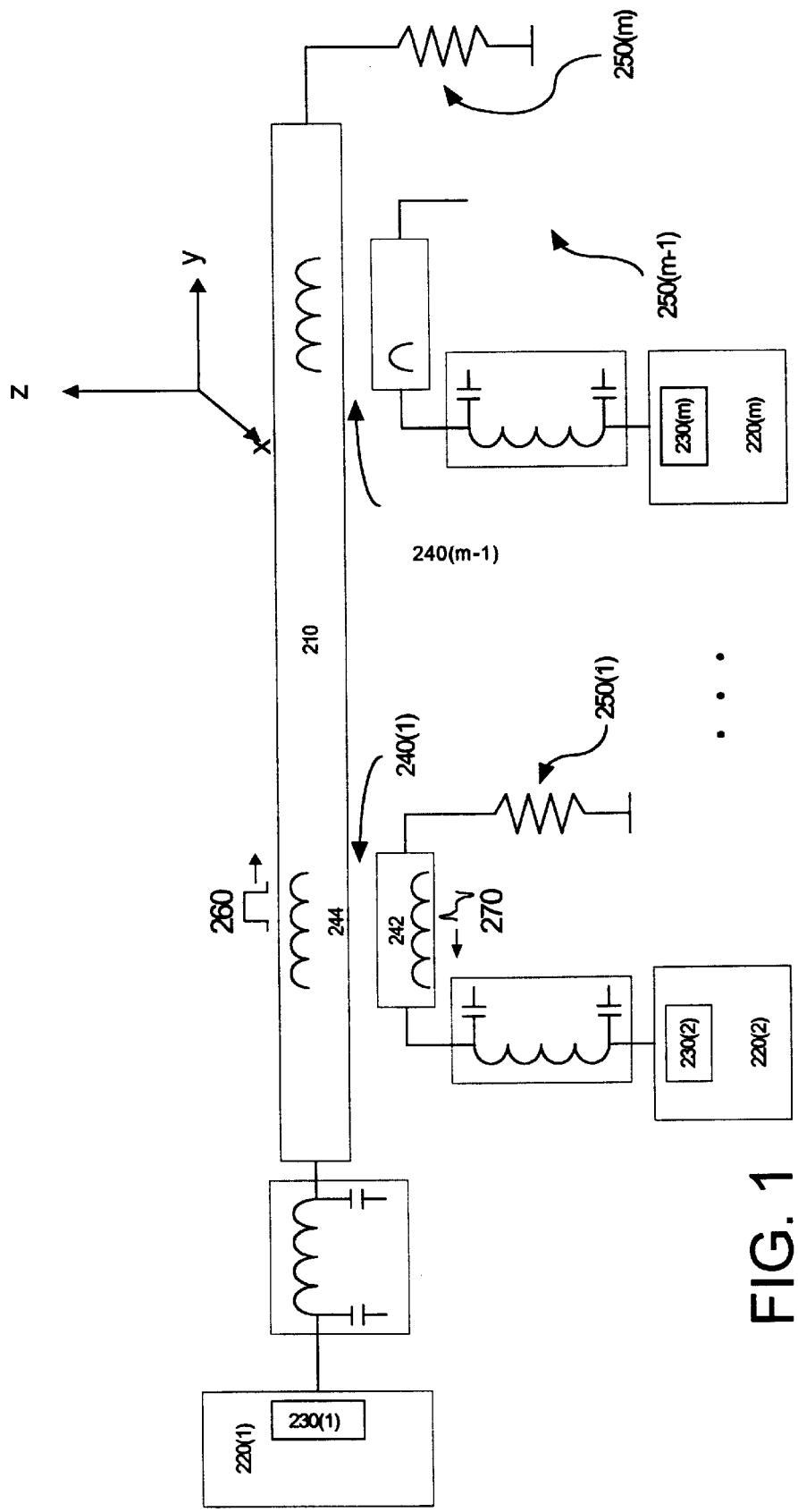
FIG. 1 is a block diagram representing an electromagnetically-coupled bus system.

FIG. 1 is a schematic representation of one embodiment of a multi-drop bus system 200. Signals are transmitted electromagnetically between a device, e.g. device 220(2), and bus 210 through electromagnetic coupler 240(1). In the following discussion, electromagnetic coupling refers to the transfer of signal energy through the electric and magnetic fields associated with the signal. In general, a signal transferred across electromagnetic coupler 240 is differentiated. For example, a positive signal pulse 260 on bus side 244 of electromagnetic coupler 240 becomes a positive/negative-going pulse 270 on device side 242 of electromagnetic coupler 240. The modulation scheme(s) employed in system 200 is selected to accommodate the amplitude attenuation and signal differentiation associated with electromagnetic couplers 240 without degrading the reliability of the communication channel.

For one embodiment of the invention, multi-drop bus system 200 is a computer system and devices 220 correspond to various system components, such as processors, memory modules, system logic and the like.

In the following discussion, various time-domain modulation schemes are used for purposes of illustration. The benefits of the present invention are not limited to the disclosed modulation schemes. Other time-domain modulation schemes, such as shape modulation (varying the number of edges in a pulse), narrowband and wideband frequency-domain modulation schemes, such as frequency modulation, phase modulation, and spread spectrum, or combinations of both time and frequency-domain modulation schemes (a pulse superposed with a high frequency sinusoid), are also suitable for use with this invention.

Figure 2:
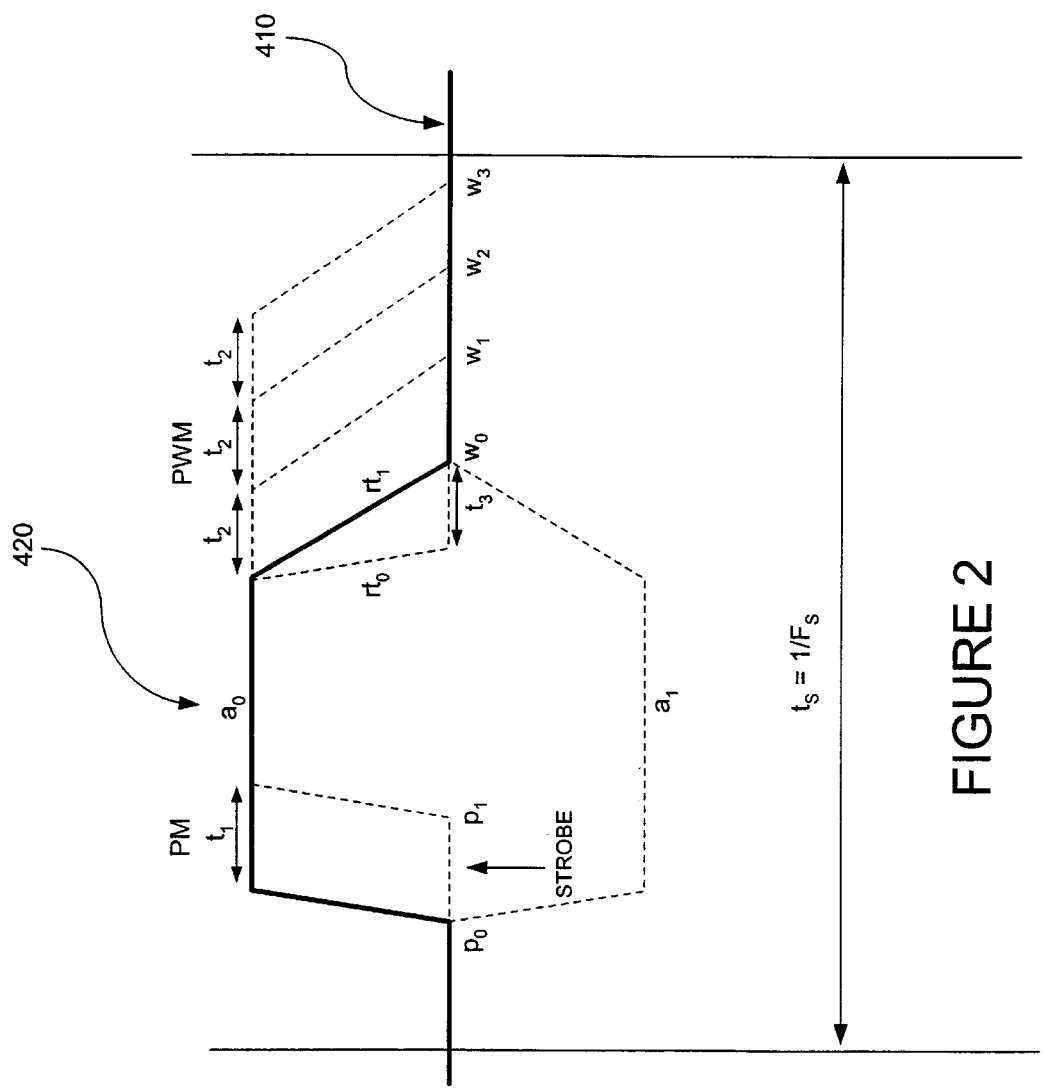
FIG. 2 is a schematic representation of a symbol that represents multiple bits of data.

FIG. 2 is a schematic representation of a signal 410 that illustrates the interplay between $F_s$, $N_s$, and various modulation schemes that may be employed to encode multiple data bits into a symbol. Signal 410 includes a modulated symbol 420 transmitted in a symbol period ($F_s^{-1}$). For purposes of illustration, phase, pulse-width, rise-time, and amplitude modulation schemes are shown encoding five bits of data ($N_s=5$) in symbol 420. The present invention may implement these modulation schemes as well as others, alone or in combination, to increase the bandwidth for a particular system. The modulation scheme(s) may be selected by considering the bit interval (see below), noise sources, and circuit limitations applicable to each modulation scheme under consideration, and the symbol period available for a given frequency.

In the following discussion, a "pulse" refers to a signal waveform having both a rising edge and a falling edge. For pulse-based signaling, information may be encoded, for example, in the edge positions, edge shapes (slopes), and signal amplitudes between edge pairs. The present invention is not limited to pulse-based signaling, however. Other signal waveforms, such as edge-based signaling and various types of amplitude, phase, or frequency-modulated periodic waveforms may be implemented as well. The following discussion focuses on modulation of pulse-based signaling schemes to elucidate various aspects of the present invention, but these schemes are not necessary to practice the invention. Considerations similar to those discussed below for pulse-based signaling may be applied to other signal waveforms to select an appropriate modulation scheme.

For signal 410, the value of a first bit (0 or 1) is indicated by where ($p_0$ or $p_1$) the leading edge of symbol 420 occurs in the symbol period (phase modulation or PM). The values of second and third bits are indicated by which of 4 possible widths ($w_0$, $w_1$, $w_2$, $w_3$) the pulse has (pulse-width modulation or PWM). The value of a fourth bit is indicated by whether the falling edge has a large ($rt_0$) or small ($rt_1$) slope (rise-time modulation or RTM), and the value of a fifth bit is indicated by whether the pulse amplitude is positive or negative ($a_0$, $a_1$) (amplitude modulation or AM). Bold lines indicate an actual state of symbol 420, and dashed lines indicate other available states for the described encoding schemes. A strobe is indicated within the symbol period to provide a reference time with which the positions of the rising and falling edges may be compared. The number of bits encoded by each of the above-described modulation schemes is provided solely for illustration. In addition, RTM may be applied to the rising and/or falling edges of symbol 420, and AM may encode bits in the magnitude and/or sign of symbol 420.

PM, PWM, and RTM are examples of time-domain modulation schemes. Each time-domain modulation scheme encodes one or more bits in the time(s) at which one or more events, such as a rising edge or a rising edge followed by a falling edge, occur in the symbol period. That is, different bit states are represented by different event times or differences between event times in the symbol period. A bit interval associated with each time-domain modulation scheme represents a minimum amount of time necessary to reliably distinguish between the different bit states of the scheme. The modulation schemes selected for a particular system, and the number of bits represented by a selected modulation scheme is determined, in part, by the bit intervals of the candidate modulation schemes and the time available to accommodate them, i.e. the symbol period.

In FIG. 2, $t_1$ represents a minimum time required to distinguish between $p_0$ and $p_1$ for a phase modulation scheme. One bit interval of duration $t_1$ is allocated within the symbol period to allow the pulse edge to be reliably assigned to $p_0$ or $p_1$. The value of $t_1$ depends on noise and circuit limitations that can interfere with phase measurements. For example, if the strobe is provided by a clock pulse, clock jitter may make the strobe position (time) uncertain, which increases the minimum interval necessary to reliably distinguish between $p_0$ and $p_1$. Various circuit limitations and solutions are discussed below in greater detail.

Similarly, one bit interval of duration $t_3$ is allocated within the symbol period to allow the two states ($rt_0$, $rt_1$) to be distinguished reliably. The size of $t_3$ is determined by noise and circuit limitations associated with rise time measurements. For example, rise times are differentiated by passing through coupler 240. Consequently, $t_3$ must be long enough to allow the measurement of a second derivative.

Three bit intervals of duration $t_2$ are allocated within the symbol period to allow the four states ($w_0$, $w_1$, $w_2$, $W_3$) to be reliably distinguished. The size of $t_2$ is determined by noise and circuit limitations associated with pulse width measurements. If pulse width is determined relative to a clock strobe, considerations regarding clock jitter may apply. If pulse width is determined relative to, e.g., the leading edge of a pulse, considerations such as supply voltage variations between the measurements of the leading and trailing edges may apply.

In general, the time needed to encode an n-bit value in a time-domain modulation scheme (i) that has a bit interval, $t_i$, is $(2^n-1) \cdot t_i$. If non-uniform bit intervals are preferred for noise or circuit reasons, the total time allotted to a modulation scheme is the sum of all of its bit intervals. When multiple time-domain modulation schemes are employed, the symbol period should be long enough to accommodate $\Sigma(2^{n(i)}-1) \cdot t_i$, plus any additional timing margins. Here, the summation is over all time-domain modulation schemes used. In the above example, the symbol period should accommodate $t_1+t_3+3t_2$, plus any other margins or timings. These may include minimum pulse widths indicated by channel bandwidth, residual noise, and the like.

Using multiple encoding schemes reduces the constraints on the symbol time. For example, encoding 5 bits using pulse width modulation alone requires at least $31 \cdot t_2$. If $t_2$ is large enough, the use of the single encoding scheme might require a larger symbol period (lower symbol frequency) than would otherwise be necessary.

A minimum resolution time can also be associated with amplitude modulation. Unlike the time domain modulation schemes, amplitude modulation encodes data in pulse properties that are substantially orthogonal to edge positions. Consequently, it need not add directly to the total bit intervals accommodated by the symbol period. For example, amplitude modulation uses the sign or magnitude of a voltage level to encode data.

The different modulation schemes are not completely orthogonal, however. In the above example, two amplitude states (positive and negative) encode one bit, and the minimum time associated with this interval may be determined, for example, by the response time of a detector circuit to a voltage having amplitude, A. The pulse width should be at least long enough for the sign of A to be determined. Similarly, a symbol characterized by rise-time state $rt_1$ and width state $w_3$ may interfere with a next symbol characterized by phase state $p_0$. Thus, noise and circuit limitations (partly summarized in the bit intervals), the relative independence of modulation schemes, and various other factors are considered when selecting modulation schemes to be used with the present invention.

Figure 3B:
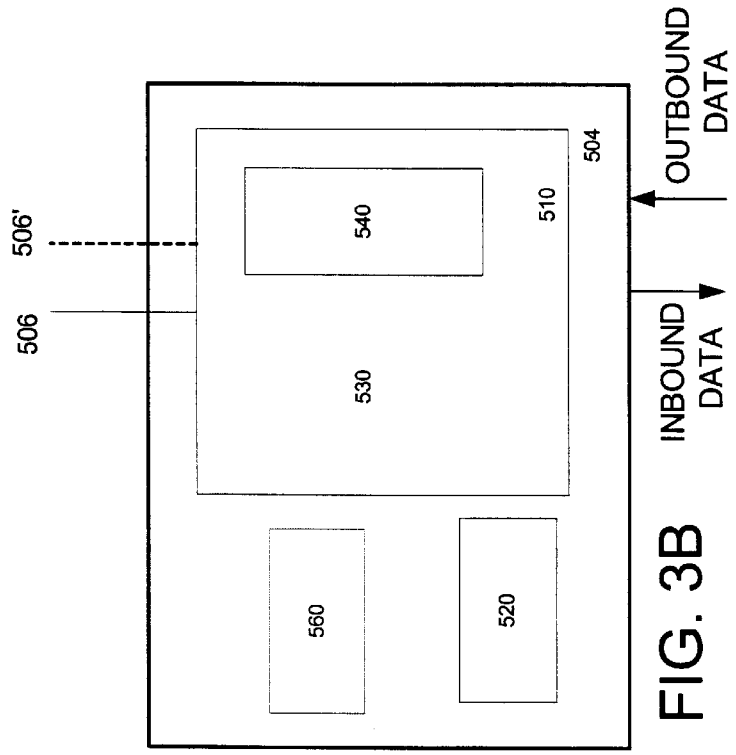
FIGS. 3A and 3B are block diagrams of an interface that is suitable for use with the present invention.
Figure 3A:
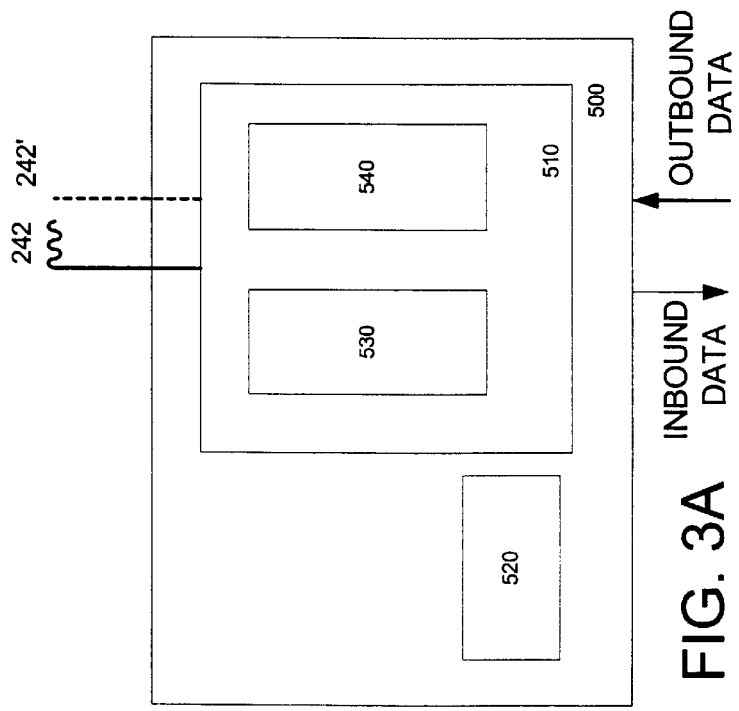

FIG. 3A is a block diagram of an embodiment 500 of interface 230 suitable for processing multi-bit symbols for devices 220(2)–220(m). For example, interface 500 may be used to encode outbound bits from, e.g., device 220(2) into a corresponding symbol for transmission on bus 210, and to decode a symbol received on bus 210 into inbound bits for use by device 220(2).

The disclosed embodiment of interface 230 includes a transceiver 510 and a calibration circuit 520. Also shown in FIG. 3A is device side component 242 of electromagnetic coupler 240 to provide a transferred waveform to transceiver 510. For example, the transferred waveform may be the differentiated waveform generated by transmitting pulse 420 across electromagnetic coupler 240. A device side component 242 is provided for each channel, e.g. bus trace, on which interface 230 communicates. A second device side component 242' is indicated for the case in which differential signaling is employed.

Transceiver 510 includes a receiver 530 and a transmitter 540. Receiver 530 recovers the bits encoded in the transferred waveform on device side component 242 of electromagnetic coupler 240 and provides the recovered bits to the device associated with interface 230. Embodiments of receiver 530 may include an amplifier to offset the attenuation of signal energy on transmission across electromagnetic coupler 240. Transmitter 540 encodes data bits provided by the associated device into a symbol and drives the symbol onto device side 242 of electromagnetic coupler 240.

Calibration circuit 520 manages various parameters that may impact the performance of transceiver 510. For one embodiment of interface 230, calibration circuit 520 may be used to adjust termination resistances, amplifier gains, or signal delays in transceiver 510, responsive to variations in process, temperature, voltage, and the like.

FIG. 3B is a block diagram of an embodiment 504 of interface 230 that is suitable for processing encoded symbols for a device that is directly connected to the communication channel. For example, in system 200 (FIG. 1), device 220(1) may represent the system logic or chipset of a computer system that is directly connected to a memory bus (210), and devices 220(2)–220(m) may represent memory modules for the computer system. Accordingly, a DC connection 506 is provided for each channel or trace on which interface 504 communicates. A second DC connection 506' (per channel) is indicated for the case in which differential signaling is employed. Interface 504 may include a clock synchronization circuit 560 to account for timing differences in signals forwarded from different devices 220(2)–220(m) and a local clock.

Figure 4:
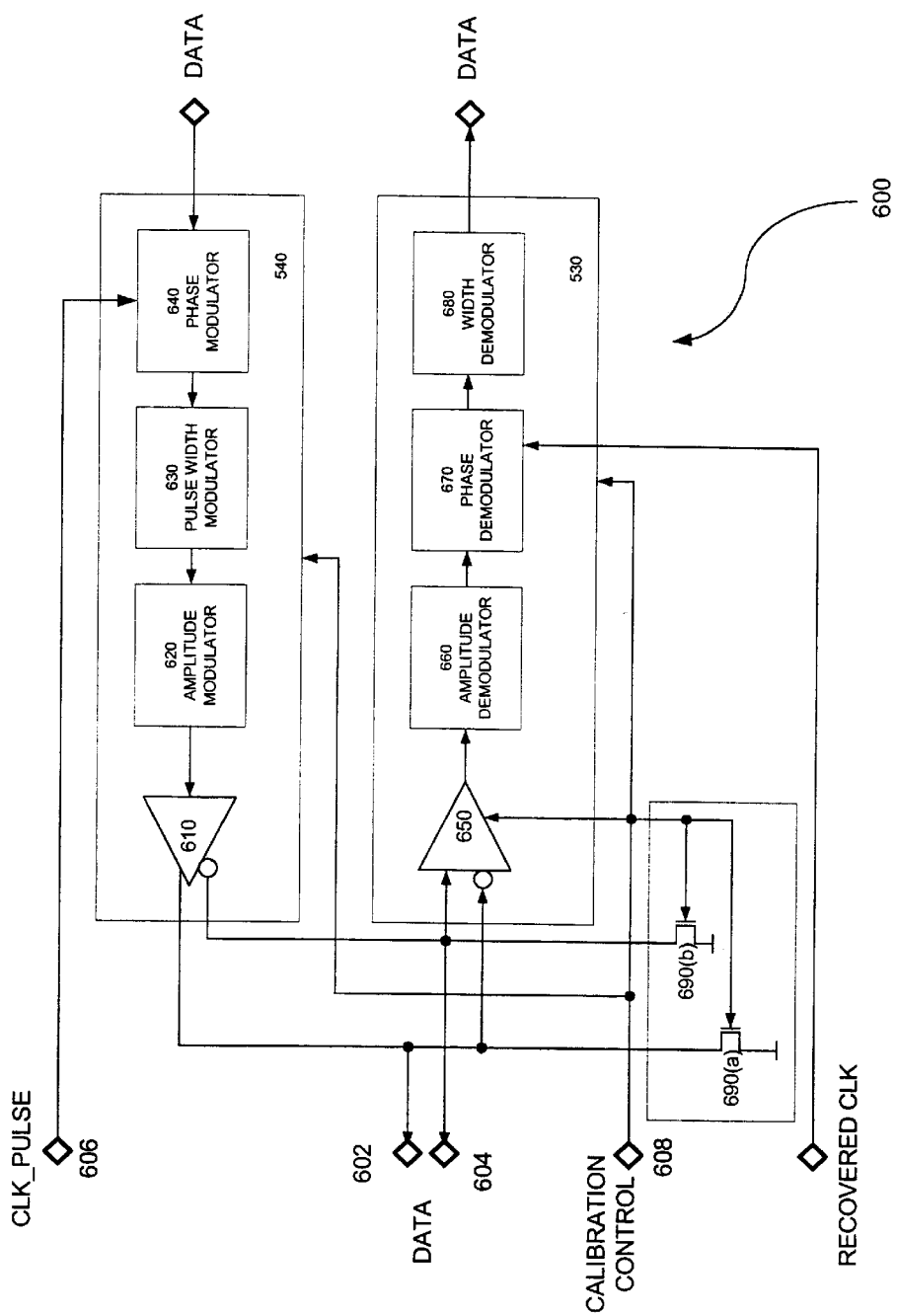
FIG. 4 is a block diagram of a transceiver module.

FIG. 4 is a block diagram representing an embodiment 600 of transceiver 510 that is suitable for handling waveforms in which data bits are encoded using phase, pulse-width and amplitude modulation, and the strobe is provided by a clock signal. Transceiver 600 supports differential signaling, as indicated by data pads 602, 604, and it receives calibration control signals from, e.g., calibration circuit 520, via control signals 608.

For the disclosed embodiment of transceiver 510, transmitter 540 includes a phase modulator 640, a pulse-width modulator 630, an amplitude modulator 620 and an output buffer 610. Output buffer 610 provides inverted and non-inverted outputs to pads 602 and 604, respectively, to support differential signaling. A clock signal is provided to phase modulator 640 to synchronize transceiver 510 with a system clock. The disclosed configuration of modulators 620, 630, and 640 is provided only for purposes of illustration. The corresponding modulation schemes may be applied in a different order or two or more schemes may be applied in parallel.

The disclosed embodiment of receiver 530 includes an amplifier 650, an amplitude demodulator 660, a phase demodulator 670, and a pulse-width demodulator 680. The order of demodulators 660, 670, and 680 is provided for illustration and is not required to implement the present invention. For example, various demodulators may operate on a signal in parallel or in an order different from that indicated.

Devices 690(a) and 690(b) (generically, "device 690") act as on-chip termination impedances, which in one embodiment of this invention are active while interface 230 is receiving. The effectiveness of device 690 in the face of, e.g., process, temperature, and voltage variations may be aided by calibration circuit 520. For transceiver 600, device 690 is shown as an N device, but the desired functionality may be provided by multiple N and/or P devices in series or in parallel. The control provided by calibration circuit 520 may be in digital or analog form, and may be conditioned with an output enable.

Figure 5A:
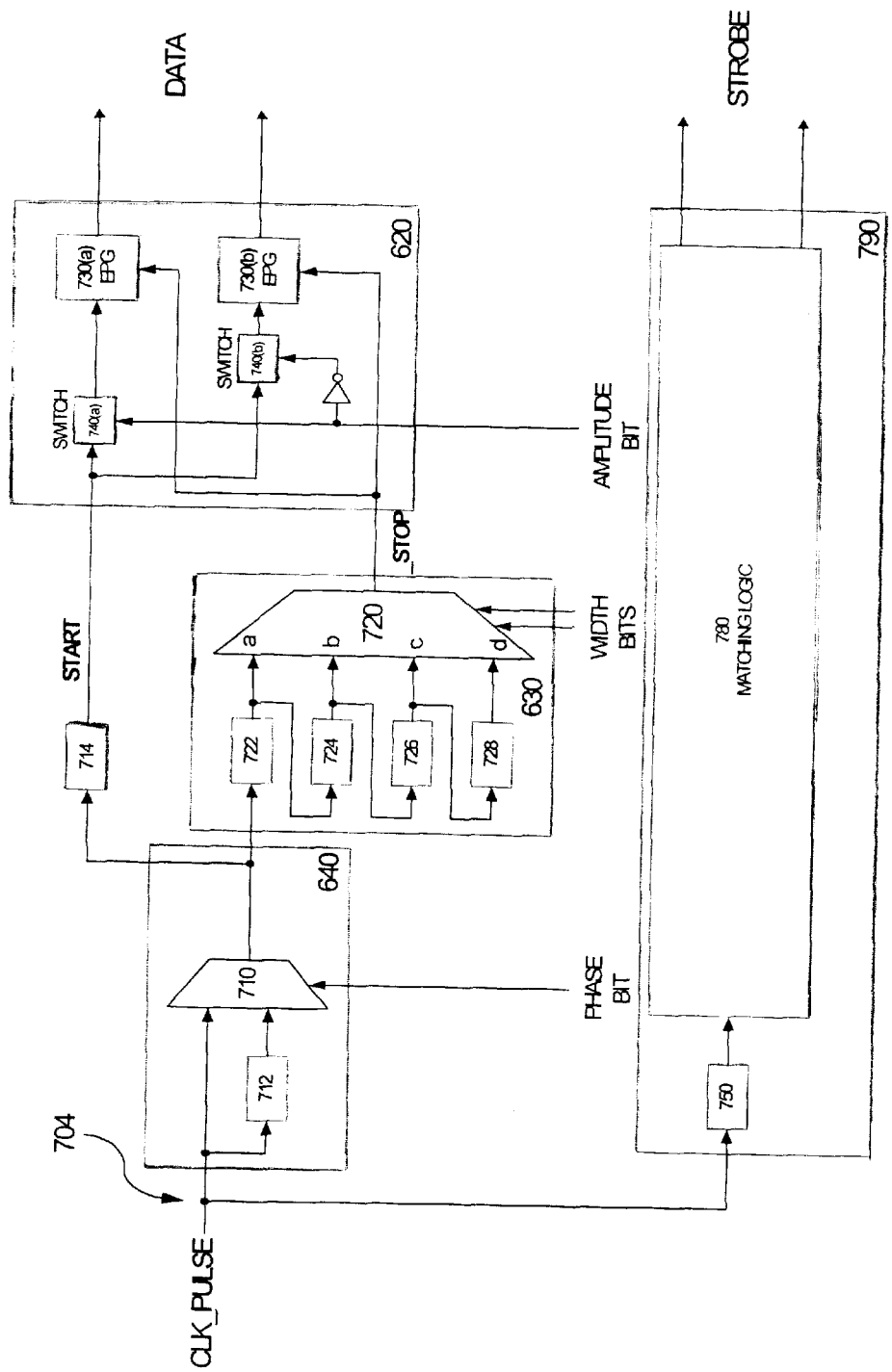
FIGS. 5A–5D are circuit diagrams for various components of the transmitter of FIG. 4.

FIG. 5A is a circuit diagram of one embodiment of transmitter 540 and its component modulators 620, 630, 640. Also shown is a strobe transmitter 790 suitable for generating a strobe signal, which may be transmitted via bus 210. For one embodiment of system 200, two separate strobes are provided. One strobe is provided for communications from device 220(1) to devices 220(2) through 220(m), and another strobe is provided for communications from devices 220(2) through 220(m) back to device 220(1).

The disclosed embodiment of transmitter 540 modulates a clock signal (CLK_PULSE) to encode four outbound bits per symbol period. One bit is encoded in the symbol's phase (phase bit), two bits are encoded in the symbol's width (width bits) and one bit is encoded in the symbol's amplitude (amplitude bit). Transmitter 540 may be used to generate a differential symbol pulse per symbol period, and strobe transmitter 790 may be used to generate a differential clock pulse per symbol period.

Phase modulator 640 includes a MUX 710 and delay module (DM) 712. MUX 710 receives a delayed version of CLK_PULSE via DM 712 and an undelayed version of CLK_PULSE from input 704. The control input of MUX 710 transmits a delayed or undelayed first edge of CLK_PULSE responsive to the value of the phase bit. In general, a phase modulator 640 that encodes p phase bits may select one of $2^p$ versions of CLK_PULSE subject to different delays. For the disclosed embodiment, the output of phase modulator 640 indicates the leading edge of symbol 420 and serves as a timing reference for generation of the trailing edge by width modulator 630. A delay-matching block (DMB) 714 is provided to offset circuit delays in width modulator 630 (such as the delay of MUX 720) which might detrimentally impact the width of symbol 420. The output of DMB 714 is a start signal (START), which is provided to amplitude modulator 620 for additional processing.

Width modulator 630 includes DMs 722, 724, 726, 728, and MUX 720 to generate a second edge that is delayed relative to the first edge by an amount indicated by the width bits. The delayed second edge forms a stop signal (_STOP) that is input to amplitude modulator 620 for additional processing. For the disclosed embodiment of transmitter 540, two bits applied to the control input of MUX 720 select one of four different delays for the second edge, which is provided at the output of MUX 720. Inputs a, b, c, and d of MUX 720 sample the input signal, i.e. the first edge, following its passage through DMs 722, 724, 726, and 728, respectively. If the width bits indicate input c, for example, the second edge output by MUX 720 is delayed by DM 722+DM 724+DM 726 relative to the first edge.

Amplitude modulator 620 uses START and _STOP to generate a symbol pulse having a first edge, a width, and a polarity indicated by the phase, width, and amplitude bits, respectively, provided to transmitter 540 for a given symbol period. Amplitude modulator 620 includes switches 740(a) and 740(b) which route START to edge-to-pulse generators (EPG) 730(a) and 730(b), respectively, depending on the state of the amplitude bit. Switches 740 may be AND gates, for example. _STOP is provided to second inputs of EPGs 730(a) and 730(b) (generically, EPG 730). On receipt of START, EPG 730 initiates a symbol pulse, which it terminates on receipt of _STOP. Depending on which EPG 730 is activated, a positive or a negative going pulse is provided to the output of transmitter 540 via differential output buffer 610.

Strobe transmitter 790 includes DM 750 and matching logic block 780. DM 750 delays CLK_PULSE to provide a strobe signal that is suitable for resolving the data phase choices p0 and p1 of symbol 420. For one embodiment of strobe transmitter 790, DM 750 positions the strobe evenly between the phase bit states represented by p0 and p1 (FIG. 2). The strobe is used by, e.g., receiver 530 to demodulate phase by determining if the leading edge of data arrives before or after the strobe. DM 750 of strobe transmitter 790 thus corresponds to phase modulator 640 of data transmitter 540. Matching logic block 780 duplicates the remaining circuits of transmitter 540 to keep the timing of the strobe consistent with the data, after DM 750 has fixed the relative positioning.

In general, DM 750 and matching logic block 780 duplicate for the strobe the operations of transmitter 540 on data signals at the level of physical layout. Consequently, this delay matching is robust to variations in process, temperature, voltage, etc. In addition, the remainder of the communication channel from the output of transmitter 540, through board traces, electromagnetic coupler 240, board traces on the other side of coupler 240, and to the inputs of receiver 530 at the receiving device, may be matched in delays between data and strobe in order to keep the chosen relative timing. However, the matching of delays is one embodiment described for illustrative purposes and is not necessary to practice this invention. For example, if the circuits and remainder of the channel do not maintain matched data to strobe delays, receivers may calibrate for the relative timing of the strobe or even compensate for the absence of a strobe by recovering the timing from appropriately encoded data.

Figure 5C:
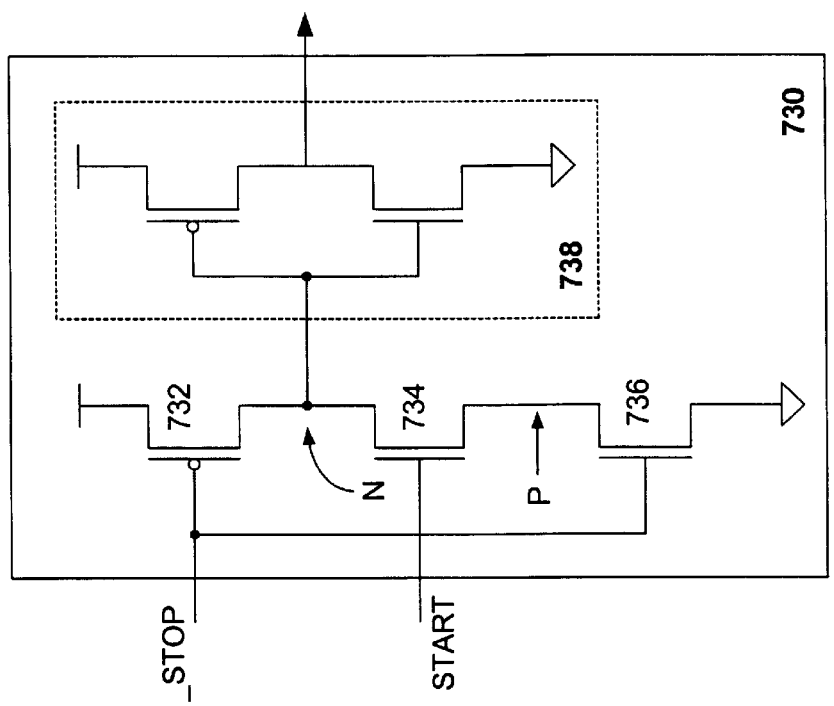
Figure 5B:
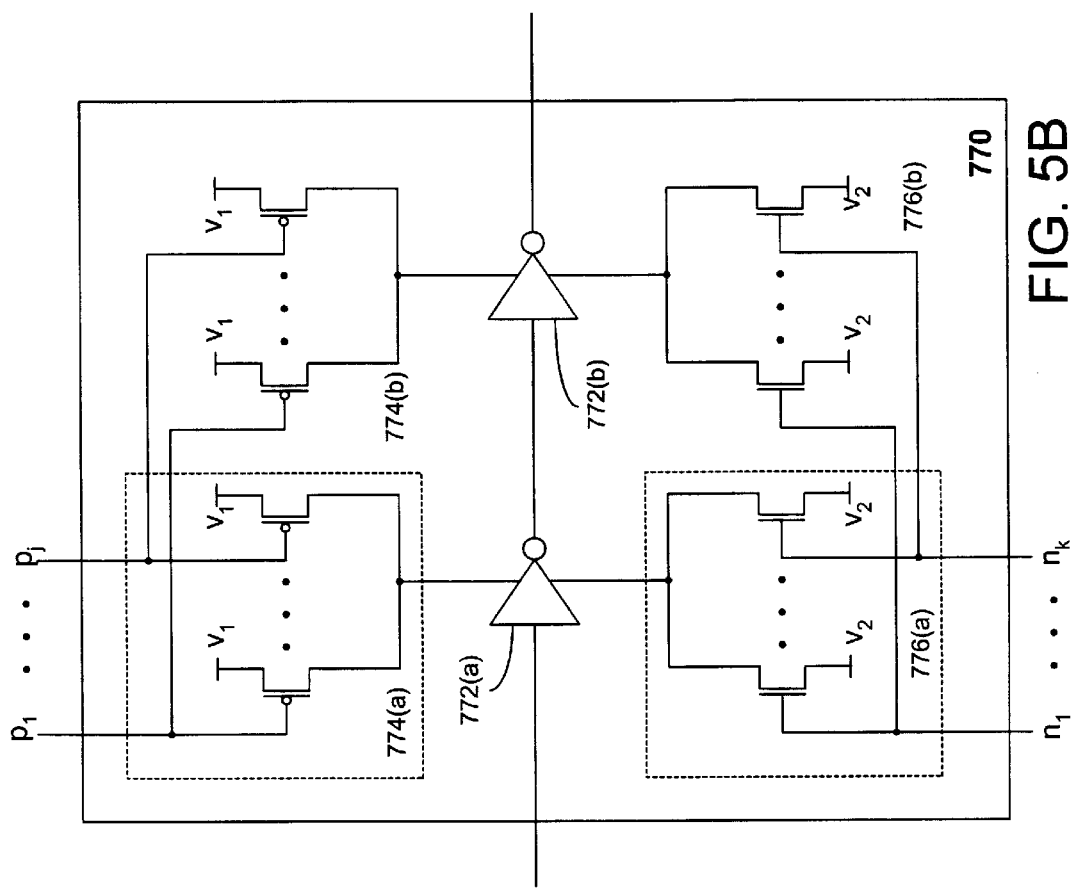

FIG. 5B is a schematic diagram of one embodiment of a programmable delay module (DM) 770 that is suitable for use with the present invention. For example, one or more DMs 770 may be used for any of DMs 712, 722, 724, 726, 728, and 750 in the disclosed embodiment of transmitter 540 to introduce programmable delays in START and _STOP. DM 770 includes inverters 772(a) and 772(b) that are coupled to reference voltages $V_1$ and $V_2$ through first and second transistor sets 774(a), 774(b) and 776(a), 776(b), respectively. Reference voltages $V_1$ and $V_2$ may be the digital supply voltages in some embodiments. Programming signals, $p_1$–$p_j$ and $n_1$–$n_k$, applied to transistor sets 774(a), 774(b) and 776(a), 776(b), respectively, alter the conductances seen by inverters 772(a) and 722(b) and, consequently, their speeds. As discussed below in greater detail, calibration circuit 520 may be used to select programming signals, $p_1$–$p_j$ and $n_1$–$n_k$, for inverters 772(a) and 772(b).

FIG. 5C is a schematic diagram of one embodiment of EPG 730 that is suitable for use with the present invention. The disclosed embodiment of EPG 730 includes transistors 732, 734, and 736 and inverter 738. The gate of N-type transistor 734 is driven by START. A positive-going edge on START indicates the beginning of a symbol pulse. The gates of P and N-type transistors 732 and 736, respectively, are driven by _STOP, which, for EPG 730(a) and 730(b) in FIG. 5A, is a delayed, inverted copy of START. A negative-going edge on _STOP indicates the end of a symbol pulse. When _STOP is high, transistor 732 is off and transistor 736 is on. A positive-going edge on START turns on transistor 734, pulling node N low and generating a leading edge for a symbol pulse at the output of EPG 730. A subsequent negative-going edge on _STOP, turns off transistor 736 and turns on transistor 732, pulling node N high and terminating the symbol pulse.

For a given symbol pulse, START may be deasserted (negative-going edge) before or after the corresponding _STOP is asserted. For example, the disclosed embodiment of transmitter 540 is timed with CLK_PULSE, and higher symbol densities may be obtained by employing narrow CLK_PULSEs. The widths of START and -STOP are thus a function of the CLK_PULSE width, while the separation between START and _STOP is a function of the width bits. The different possible relative arrivals of the end of START and beginning of _STOP may adversely impact the modulation of symbol 420 by the width bits. Specifically, transistor 734 may be on or off when a negative-going edge of _STOP terminates the symbol pulse. Node N may thus either be exposed to the parasitic capacitances at node P through transistor 734, or not. This variability may affect the delay of the trailing symbol edge through EPG 730 in an unintended way.

Figure 5D:
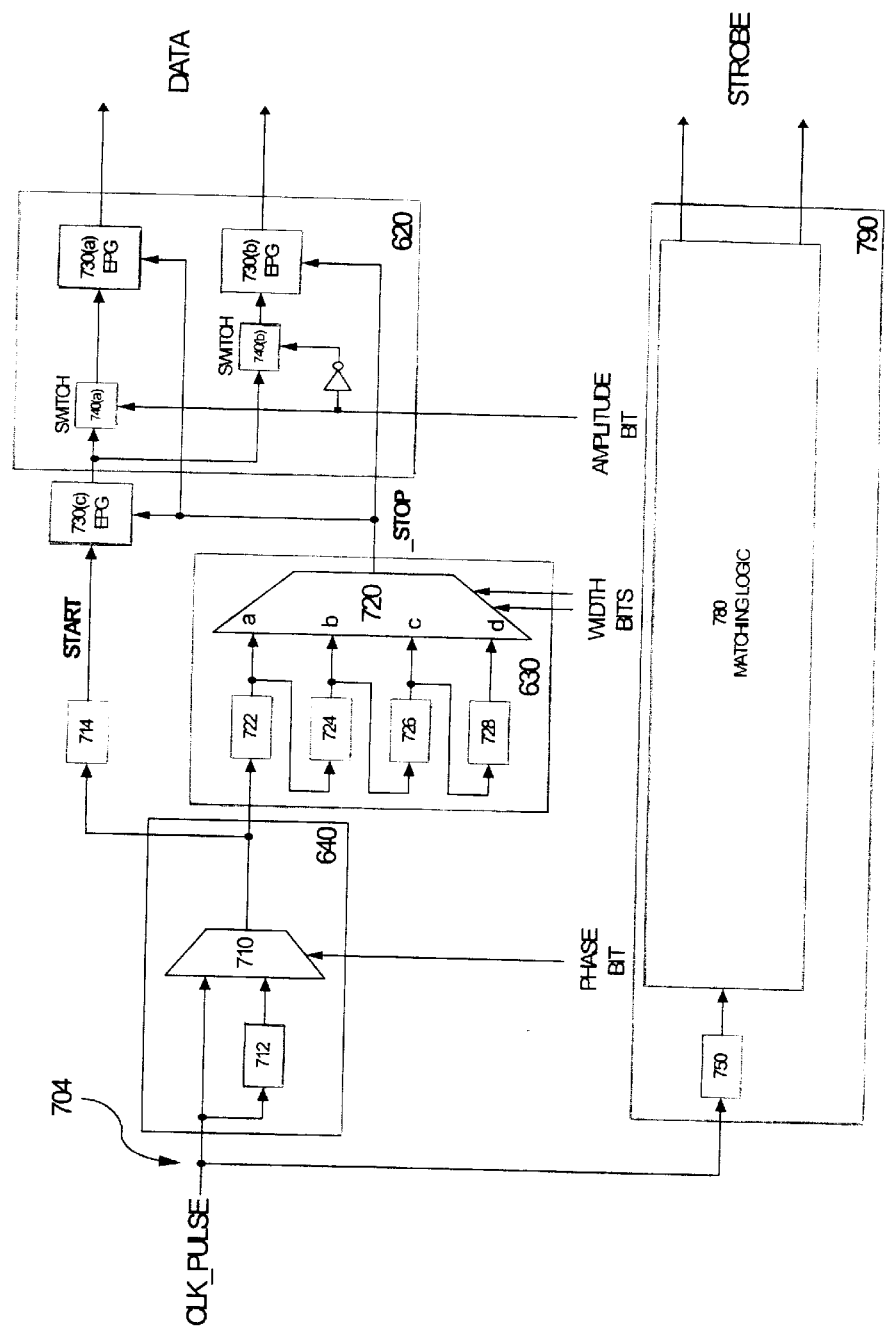

FIG. 5D is a schematic diagram of an alternative embodiment of transmitter 540 that includes an additional EPG 730(c). EPG 730(c) reshapes START to ensure a consistent timing which avoids the variability described above. Namely, the modified START is widened so that it always ends after _STOP begins. This is done by generating a new START whose beginning is indicated by the original START but whose end is indicated by the beginning of _STOP, instead of the width of CLK_PULSE. Note also that, in the alternative embodiment shown in FIG. 5D, the sum of the delays through delay matching block 714 and EPG 730(c) must match the unintended delays in width modulator 630.

FIGS. 6A–6E show CLK_PULSE, START, STOP, SYMBOL, and TR_SYMBOL, respectively, for one embodiment of system 200. Here, TR_SYMBOL represents the form of SYMBOL following transmission across electromagnetic coupler 240. The smaller amplitude of TR_SYMBOL relative to SYMBOL is roughly indicated by the scale change between the waveforms of FIG. 6D and 6E. TR_SYMBOL represents the signal that is decoded by interface 230 to extract data bits for further processing by device 220. The 4 outbound bits encoded by each SYMBOL are indicated below the corresponding SYMBOL in the order (p, $w_1$, $w_2$, a)

Figure 7A:
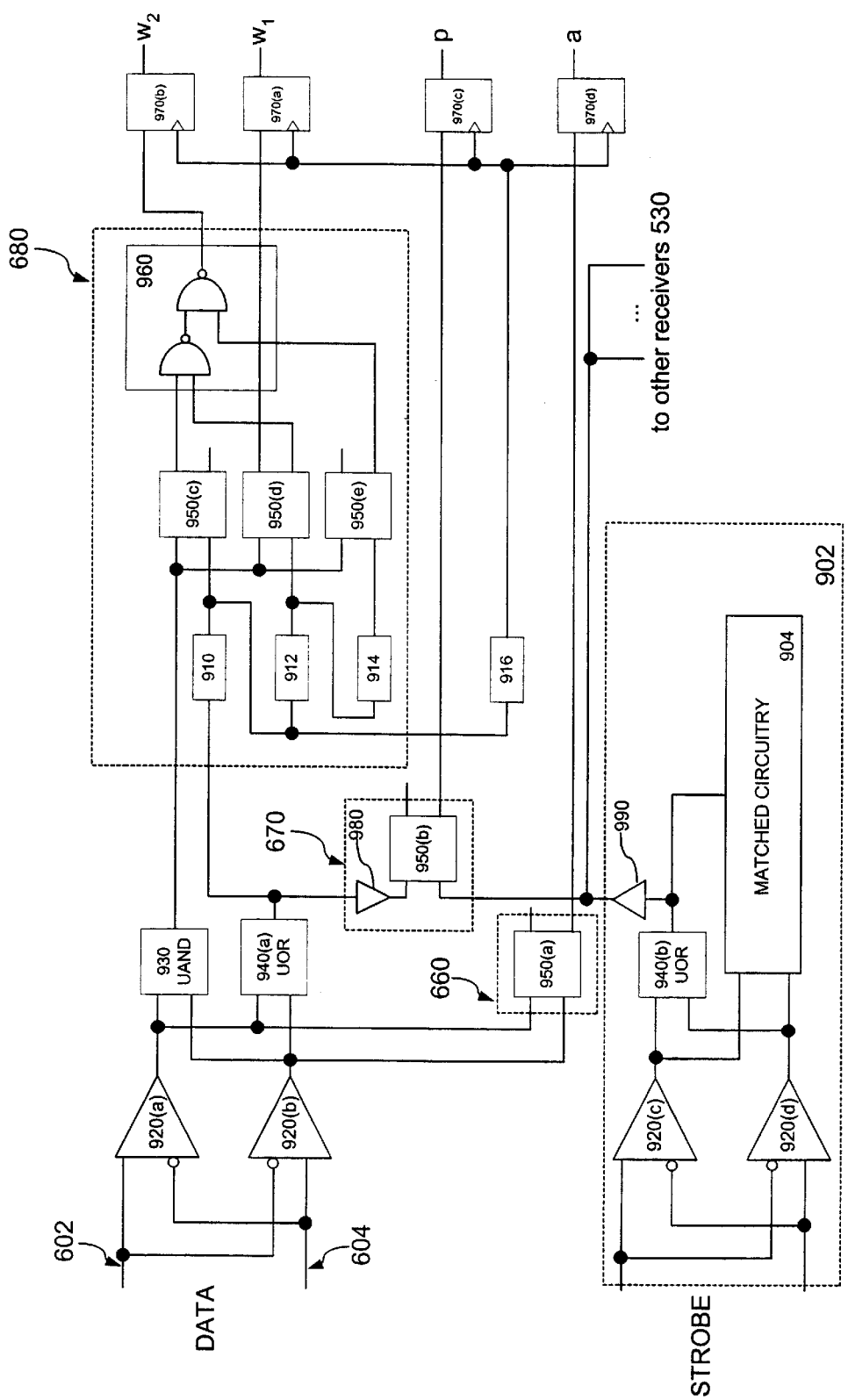

FIG. 7A is a schematic diagram representing one embodiment of receiver 530 that is suitable for use with the present invention. The disclosed embodiment of receiver 530 processes differential data signals. FIG. 7A also shows a strobe receiver 902, which is suitable for processing a differential strobe signal. Strobe receiver 902 may provide delay matching for receiver 530 similar to that discussed above. Receiver 530 and strobe receiver 902 may be used, for example, in system 200 in conjunction with the embodiments of transmitter 540 and strobe transmitter 790 discussed above.

The disclosed embodiment of receiver 530 includes differential to single-ended amplifiers 920(a) and 920(b) which compensate for the energy attenuation associated with electromagnetic coupler 240. Amplifiers 920(a) and 920(b) produce digital pulses in response to either positive or negative pulses on the transferred signal (TR_SYMBOL in FIG. 6E) and its complement, e.g. the signals at inputs 602 and 604. In addition to amplification, amplifiers 920 may latch their outputs with appropriate timing signals to provide sufficient pulse widths for succeeding digital circuits.

Matching strobe receiver 902 similarly amplifies the accompanying differential strobe signal. For the disclosed embodiment, the received strobe is used to decode phase information in data symbol 420. Strobe receiver 902 includes differential to single-ended amplifiers 920(*c*) and 920(*d*) and matched circuitry 904. Matched circuitry 904 replicates much of the remaining circuitry in receiver 530 to match delays for data and strobe signals, similar to the matching of transmitter 540 and strobe transmitter 790. One embodiment of strobe receiver 902 includes circuits that correspond to phase demodulator 670 and width demodulator 680 with some minor modifications. For example, strobe buffer 990 buffers the received strobe for distribution to multiple receivers 530, up to the number of channels in, e.g., bus 210. Strobe buffer 990 may be large, depending on the number of receivers it drives. Data buffer 980 corresponds to strobe buffer 990. To save area, data buffer 980 need not be an exact replica of strobe buffer 990. The delays can also be matched by scaling down both data buffer 980 and its loading proportionately, relative to their counterparts in strobe receiver 902.

Figure 7C:
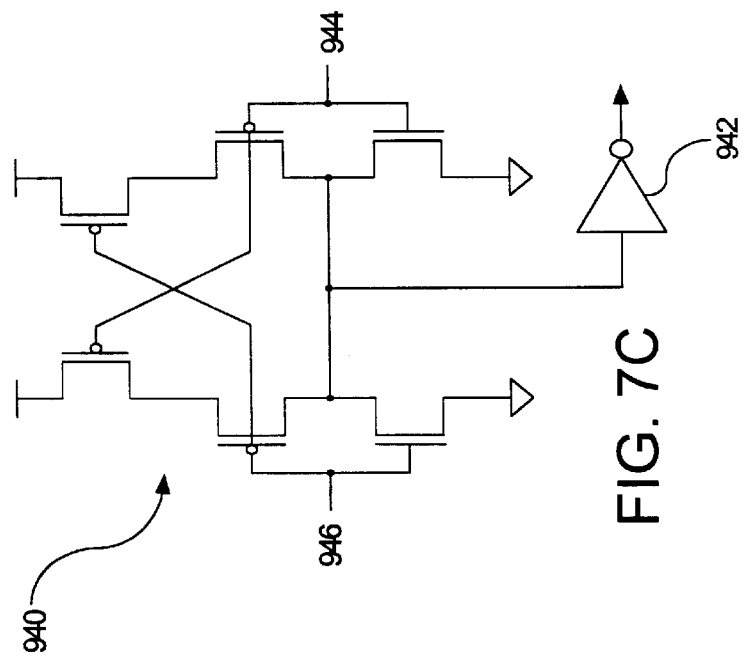
Figure 7B:
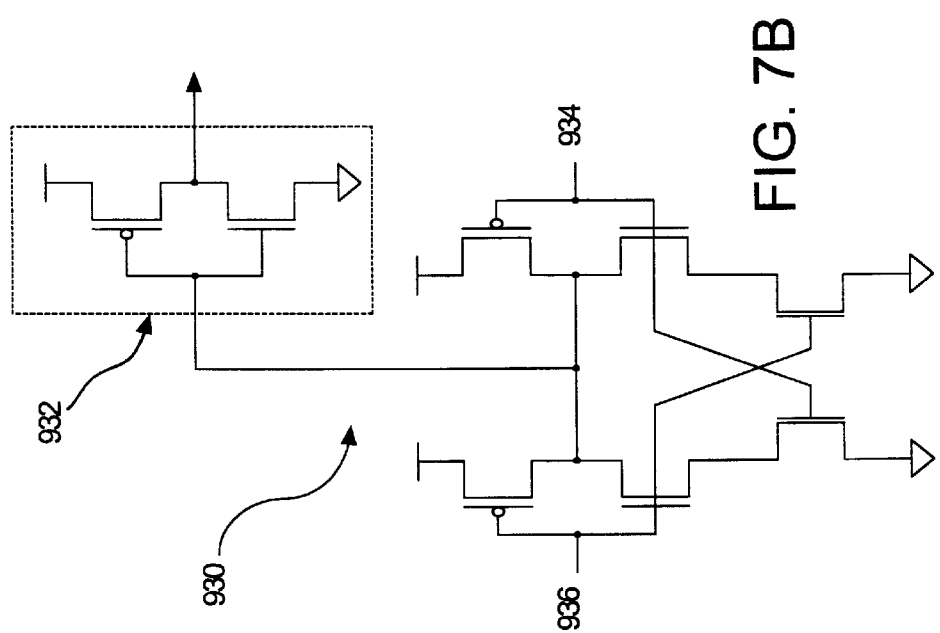

Uni-OR gate (UOR) 940(*a*) combines the outputs of amplifiers 920(*a*) and 920(*b*) to recover the first edge of TR_SYMBOL. The name uni-OR indicates that the propagation delay through gate 940 is uniform with respect to the two inputs. An embodiment of UOR 940 is shown in FIG. 7C. Similarly, uni-AND gate (UAND) 930 recovers the second edge of TR_SYMBOL. An embodiment of UAND 930 is shown in FIG. 7B.

The disclosed embodiment of phase demodulator 670 includes an arbiter 950(*b*) (generically, "arbiter 950") and data buffer 980. Arbiter 950(*b*) compares the first edge recovered from the transferred symbol by UOR 940(*a*) with the corresponding edge from the recovered strobe by UOR 940(*b*), respectively, and sets a phase bit according to whether the recovered first edge of the symbol leads or follows the first edge of the strobe. An embodiment of arbiter 950 is shown in FIG. 7D. An output 952 goes high if input 956 goes high before input 958. Output 954 goes high if input 958 goes high before input 956.

Figure 7E:
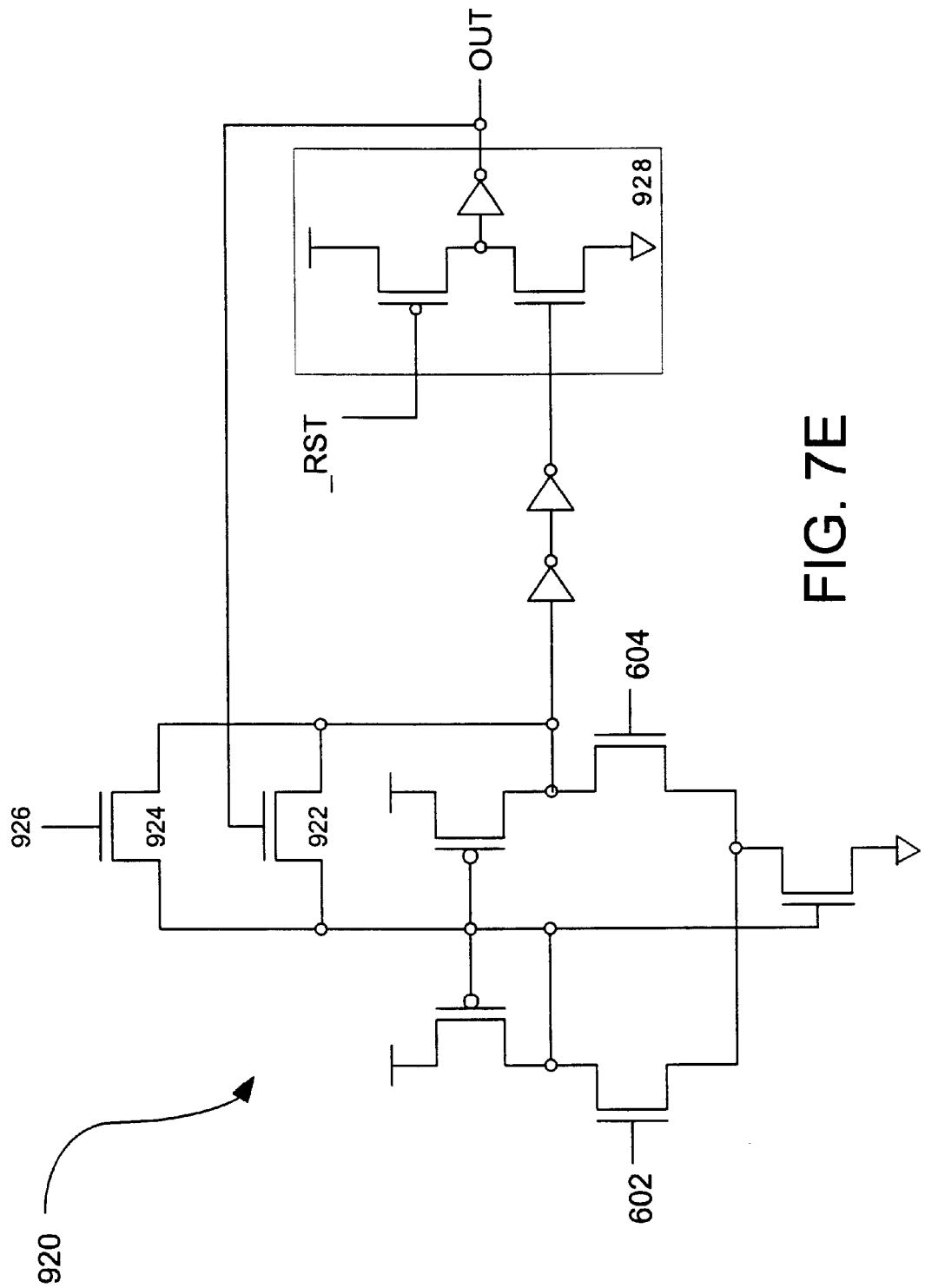

FIG. 7E is a circuit diagram representing one embodiment of amplifier 920. The disclosed embodiment of amplifier 920 includes a reset equalization device 922, a gain control device 924, and a pre-charged latch 928. Reset device 922 speeds up the resetting of amplifier 920 after a detected pulse, in preparation for the next symbol period. Gain control device 924 compensates the gain of amplifier 920 for variations in process, voltage, temperature, and the like. A control signal 926 may be provided by calibration circuit 520. More generally, device 924 may be multiple devices connected in series or parallel, and signal 926 may be several signals, analog or digital, produced by calibration circuit 520. Pre-charged latch 928 reshapes received pulses for the convenience of succeeding circuits. Resulting output pulse widths are determined by a timing signal, _RST. For one embodiment of amplifier 920, _RST is produced by DM 916 (FIG. 7A), along with other timing signals used in receiver 530. It is possible for pre-charged latch 928 and signal _RST to be in inconsistent states, due to power-on sequences or noise. Additional circuitry may be used to detect and correct such events.

The disclosed embodiment of amplitude demodulator 660 includes an arbiter 950(*a*) which receives the amplified transferred signals from amplifiers 920(*a*) and 920(*b*). Arbiter 950(*a*) sets an amplitude bit according to whether the output of amplifier 920(*a*) or 920(*b*) pulses first.

The disclosed embodiment of width demodulator 680 includes delay modules (DMs) 910, 912, 914, arbiters 950(*c*), 950(*d*), 950(*e*), and decoding logic 960. The recovered first 20 symbol edge is sent through DMs 910, 912, and 914 to generate a series of edge signals having delays that replicate the delays associated with different symbol widths. For one embodiment of the invention, DMs 910, 912, and 914 may be implemented as programmable delay modules (FIG. 5B). Arbiters 950(*c*), 950(*d*), and 950(*e*) determine the (temporal) position of the second edge with respect to the generated edge signals. Decoding logic 960 maps this position to a pair of width bits.

Latches 970(*a*), 970(*b*), 970(*c*), and 970(*d*) receive first and second width bits, the phase bit, and the amplitude bit, respectively, at their inputs, and transfer the extracted (inbound) bits to their outputs when clocked by a clocking signal. For the disclosed embodiment of receiver 530, the latches are clocked by sampling a signal from the delay chain of width demodulator 680 through the extra delay of DM 916. This latching synchronizes the demodulated bits to the accompanying strobe timing. In addition, a device 220 may require a further synchronization of the data to a local clock, e.g. clock synchronization circuit 560 in FIG. 3B. Persons skilled in the art and having the benefit of this disclosure will appreciate that this can be done in any number of different ways.

The various components in an embodiment of interface 230 include a number of circuit elements that may be adjusted to compensate for process, voltage, temperature variations and the like. For example, compensation may entail adjusting the delay provided by a programmable delay module (DM 770), the gain provided by an amplifier (amplifier 920), or the termination resistance (device sets 690(*a*) and 690(*b*)).

Figure 8:
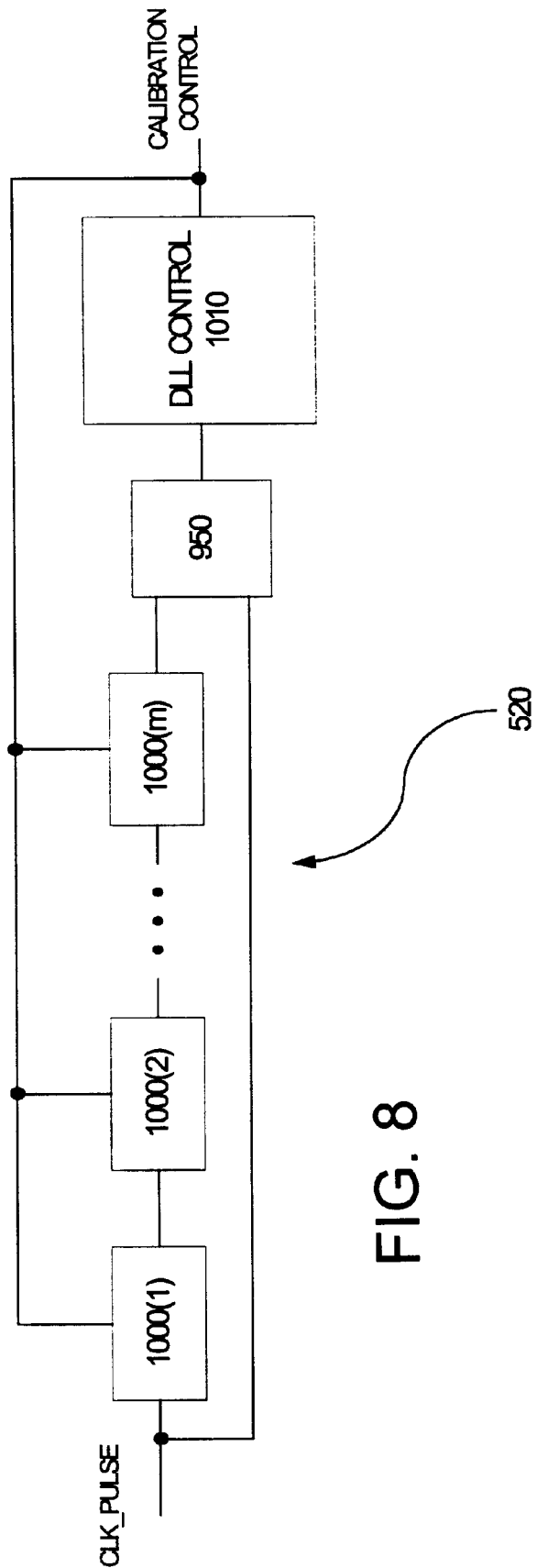
FIG. 8 is a block diagram representing a calibration circuit.

FIG. 8 shows an embodiment of calibration circuit 520. The purpose of calibration is to use feedback to measure and compensate for variable process, temperature, voltage, and the like. The embodiment of calibration circuit 520 shown in FIG. 8 is a delay-locked loop (DLL). A clock signal (CLK_PULSE) is delayed by series-connected DMs 1000(1)–1000(*m*). The number of DMs is chosen so that the sum of the delays can be set to match one period of CLK_PULSE. Arbiter 950 is used to detect when the sum of the delays through DMs 1000 is less than, equal to, or more than one clock period. DLL control 1010 cycles through delay control settings until the sum of the delays matches one clock period. The established control setting reflects the effects of process, temperature, voltage, etc . . . on the delays of DMs 1000. Calibration circuit 520 may be operated continuously, periodically, when conditions (temperature, voltage, etc.) change, or according to any of a variety of other strategies.

The same calibration control settings can be distributed to DMs used throughout interface 230, such as DM 712, DM 910, etc. The desired delays of DMs in interface 230 are achieved by selecting a number of programmable delay modules 770 for each such DM which have the same ratio to the total number of delay modules 770 included in all the DMs 1000 as the ratio of the desired delay to the clock period. For example, if there are 20 total delay modules 770 in the sum of DMs 1000, one can select a delay of one tenth of the clock period by using 2 delay modules 770 for any particular DM used in interface 230. In addition, one can also choose a fractional extra delay for any particular DM by inserting small extra loads at the outputs of selected delay modules 770 which constitute that DM.

The calibration information obtained by calibration circuit 520 may also be used to control other circuit parameters, in the face of variable conditions. These may include the resistance of termination device 690 and gain of amplifier 920. This may be done by correlating the information contained in the delay control setting with the effects of process, temperature, voltage, and like conditions on the other circuit parameters.

We now discuss aspects of the clock reshaping for the clock pulses used in connection with the modulation of the outgoing symbols.

Referring again to FIG. 5A and FIG. 5B, several delay modules (DM 770) are used in the transmitter 540 to measure out the delays required by the phase modulation and pulse width modulation encoding. The delay produced by each DM 770 in the transmitter is controlled by the programmable inputs $p_1 \ldots p_j$ and $n_1 \ldots n_k$ (The DM 770 programmable inputs may be generated by a calibration circuit 520). The programmable inputs cause current starvation of inverters 772(*a*) and 772(*b*) to produce a controllable delay through the DM 770 where less current input will drive the inverters slower and more current will drive the inverters faster. "Faster corners" may refer to conditions of process, temperature, voltage, and the like, which result in transistors which are fast both in transistor "on" conductance and in the thresholds at which transistors "turn on". The programmable inputs of DM 770 may be used to reduce the current drive of inverters 772(*a*) and 772(*b*) to compensate for circuits containing faster corners. Thus, the basic mechanism for controlling delay in the DM 770 is to adjust the speed of output rise and fall times.

Circuits containing faster corners may utilize slower rise and fall times than those exhibiting slower corners in order to maintain a desired delay. However, because the use of slower rise and fall times limits the bandwidth through the circuits, circuits exhibiting faster corners (which require slower rise and fall times) may be more bandwidth constrained than those exhibiting slower corners. This can constrain the CLK_PULSE width used as the input to the delay chains of transmitter 540. That is, in order to avoid being low pass filtered in the delay chains, the CLK_PULSE should have some minimum pulse width, and this width should be larger for faster corners.

Figure 9:
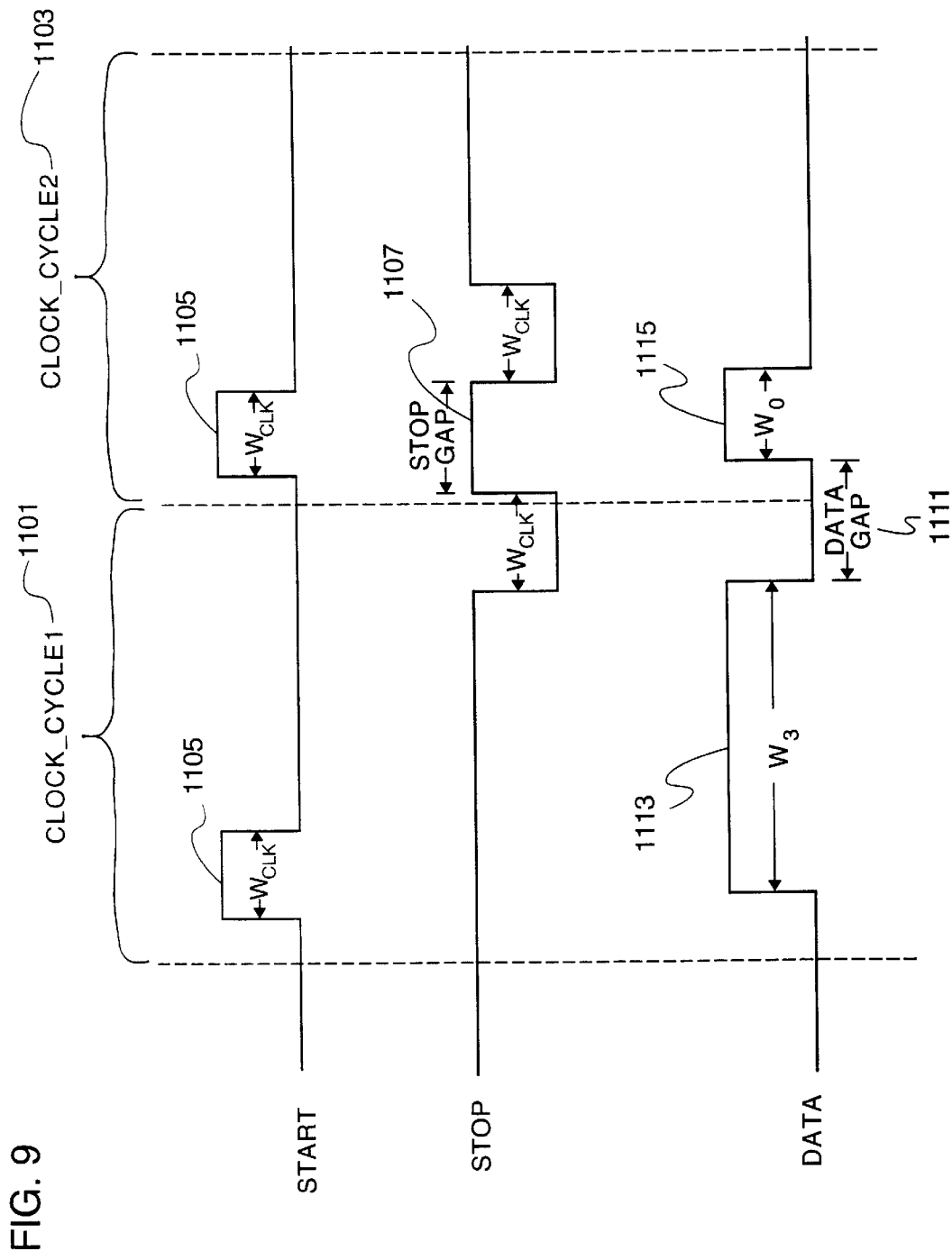
FIG. 9 is a timing diagram of various signals of the transmitter of FIG. 5A.

Additional timing constraints can be understood by examining FIG. 9, which illustrates the timing relationships of signals START, _STOP and DATA of transmitter circuit 540 (of FIG. 5A). In FIG. 9, the signals that are shown in two consecutive clock cycles 1101 and 1103, were chosen to illustrate signal transitions that represent the worst case scenario for DATA resolution. "Wclk" represents the width of a single CLK_PULSE input to the transmitter 540.

In CLOCK_CYCLE1 1101 signals are shown for phase choice p1 and width choice w3. In CLOCK_CYCLE2 1103 signals are shown for phase choice p0 and width choice w0. The clock period (between successive vertical dashed lines in the figure) must be long enough so that even in this worst case there will be a sufficiently wide DATA_GAP 1111 between the two DATA symbols 1113, 1115. A sufficiently wide DATA_GAP 1111 ensures that the DATA can be propagated reliably through the modulation circuitry and communication channel. Note that the DATA_GAP 1111 is not related to the width of Wclk, since it is only the relative positions of the leading edges of START and _STOP that determine the corresponding relative positions of the DATA symbols.

Referring again to FIG. 9, the clock period must also be long enough to allow the _STOP pulses 1109 to transition, that is, the width of STOP_GAP 1107 must be sufficiently wide to allow the two successive _STOP 1109 pulses to propagate through the transmitter circuitry without being filtered out. The width of each of the _STOP 1109 pulses is approximately equal to the width of the input CLK_PULSE (Wclk). If the clock period is reduced responsive to the timing constraints of DATA (as described above) any increase in the width of Wclk could reduce the time within a clock period that is available to achieve a sufficiently wide STOP_GAP 1107. Therefore, Wclk also has an upper limit on its width and this limit is lower for slower corners since too small a STOP_GAP 1107 (due to a Wclk which is too wide) will be filtered out by the non-current starved circuitry in transmitter 540 (such as MUX 720 in FIG. 5A). This maximum timing constraint together with the minimum pulse width constraint due to DM 770 (discussed above), combine to require a Wclk pulse width which is larger for faster corners and smaller for slower corners.

Figure 10:
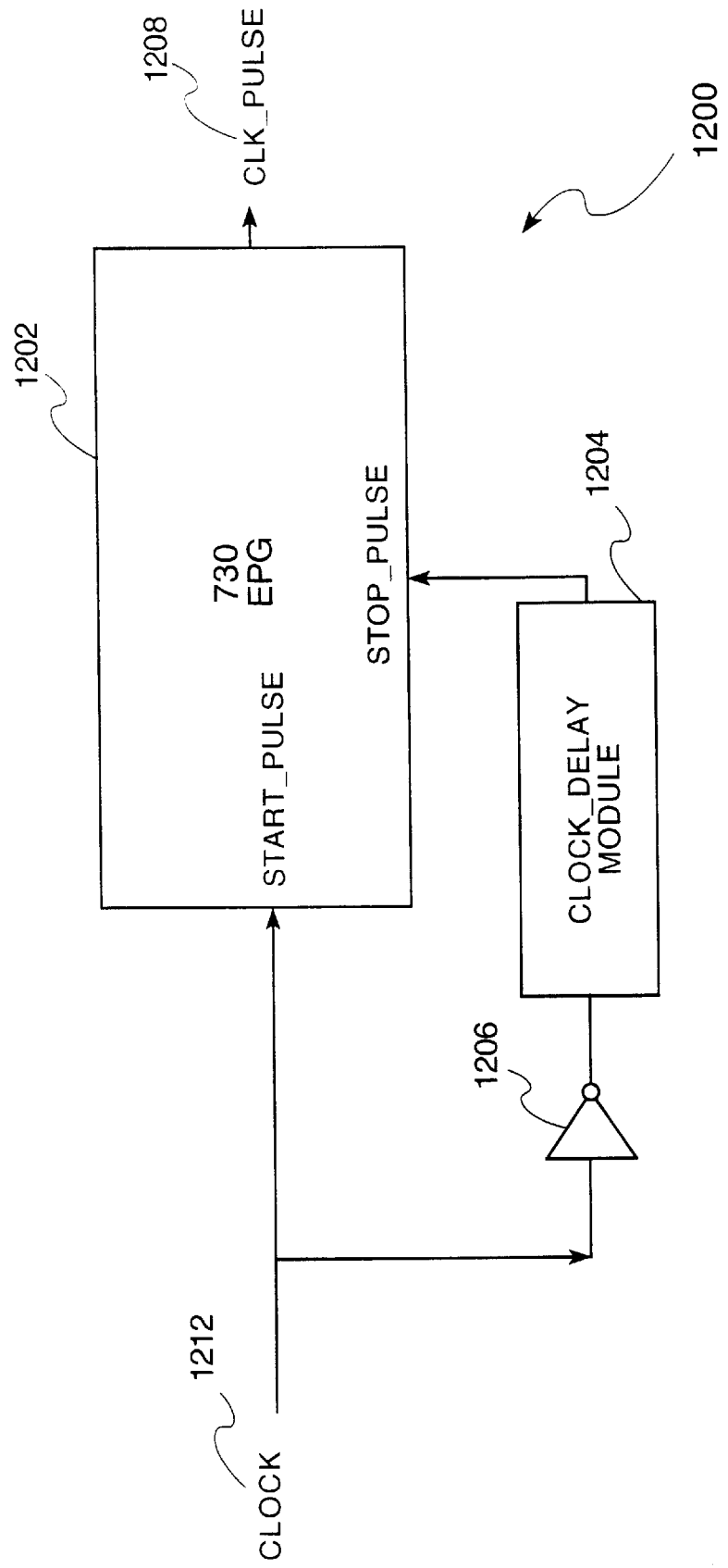
FIG. 10 is a block diagram of a clock reshaping circuit.

FIG. 10 shows an embodiment of a clock circuit 1200 that produces a CLK_PULSE 1208 for input to transmitter 540. Clock circuit 1200 produces a CLOCK_PULSE 1208 from a signal CLOCK 1212, where the CLOCK_PULSE 1208 has a width, Wclk, responsive to circuit variations of process, voltage and temperature. For the disclosed embodiment of clock circuit 1200, an edge-to-pulse-generator 1202 similar to EPG 730 in FIG. 5C, produces CLK_PULSE 1208. The pulse width of CLK_PULSE 1208 is controlled by the combined delay of a CLOCK_DELAY_MODULE 1204 (CDM) and inverter 1206. CDM 1204 adjusts Wclk to meet the timing constraints described above, that is, a Wclk which is wider for faster corners and smaller for slower corners, while avoiding in CDM 1204 the same effects being avoided in transmitter 540, namely that narrow pulses from CLOCK 1212 not be filtered out in CDM 1204.

For one embodiment of clock circuit 1200, CDM 1204 employs a circuit topology similar to DM 770, but with altered device sizes. Namely, the device sizes in an embodiment of CDM 1204 are chosen to produce a delay to compensate for varying transistor speed due to variations in process, voltage and temperature. In CDM 1204, the current limiting devices may be resized to apply progressively more current limitation compared to DM 770. The effect is to reuse the same calibrated controls from circuit 520 to produce larger delays for faster corners. This is an acceptable solution if it is known that the input CLOCK 1212 pulse can successfully propagate through such a CDM 1204. However, if CLOCK 1212 itself might contain narrow pulses (if its duty ratio is close to either 0 or 1) there may be a danger of CLOCK 1212 being filtered away in CDM 1204. Note that this example of CDM 1204 requires more current limitation to compensate for faster corners in comparison to DM 770, therefore, the narrowest pulse width allowable for DM 770 may be too narrow for such a CDM 1204.

Figure 11A:
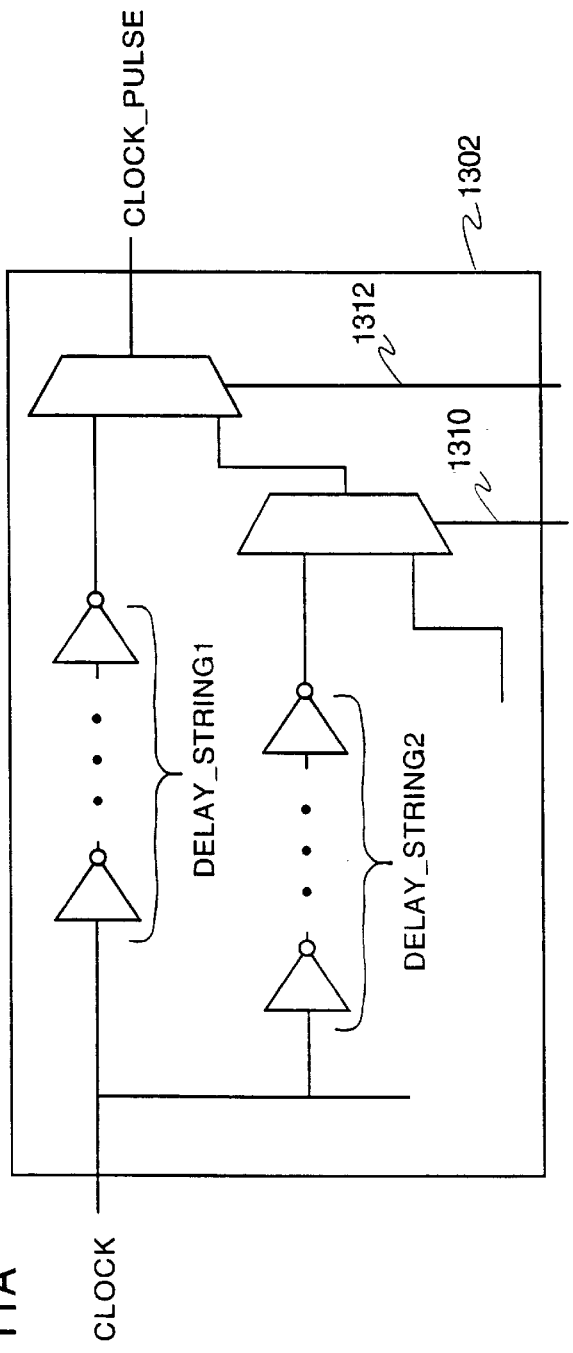
FIGS. 11A–11B are circuit diagrams of delay modules.

FIG. 11A shows another example of a CDM 1204, identified as CIRCUIT 1302, which is representative of a different category of CDM design that uses non-current starved elements to adjust the pulse width, Wclk. CIRCUIT 1302 uses a series of inverters and multiplexors as delay elements. The desired delay is achieved by choosing the total number of delay elements through which the CLOCK pulse passes. DELAY_STRING1 and DELAY_STRING2 represent strings of delay elements in which the number of delay elements are different. The number of elements in each of DELAY_STRING1 and DELAY_STRING2 is determined according to the CLOCK_PULSE width required. Control inputs to multiplexors, 1310,1312, allow DELAY_STRING1 or DELAY_STRING2 to be selected. The control inputs may be derived from the delay controls provided to a DM 770 by calibration circuit 520, or, they may be derived from other control circuitry. Because the circuit elements of CIRCUIT 1302 do not employ current starvation, they do not suffer from the bandwidth limitations described for the previous example (that is, a CDM 1204 using a DM 770 circuit topology), and can therefore be used where the CLOCK may contain narrow pulses. Since the total delay in CIRCUIT 1302 is created by including or excluding inverters or multiplexors, the result is a limited delay granularity in comparison to the more finely tunable delay of the previous example which uses a circuit topology similar to DM 770.

Figure 11B:
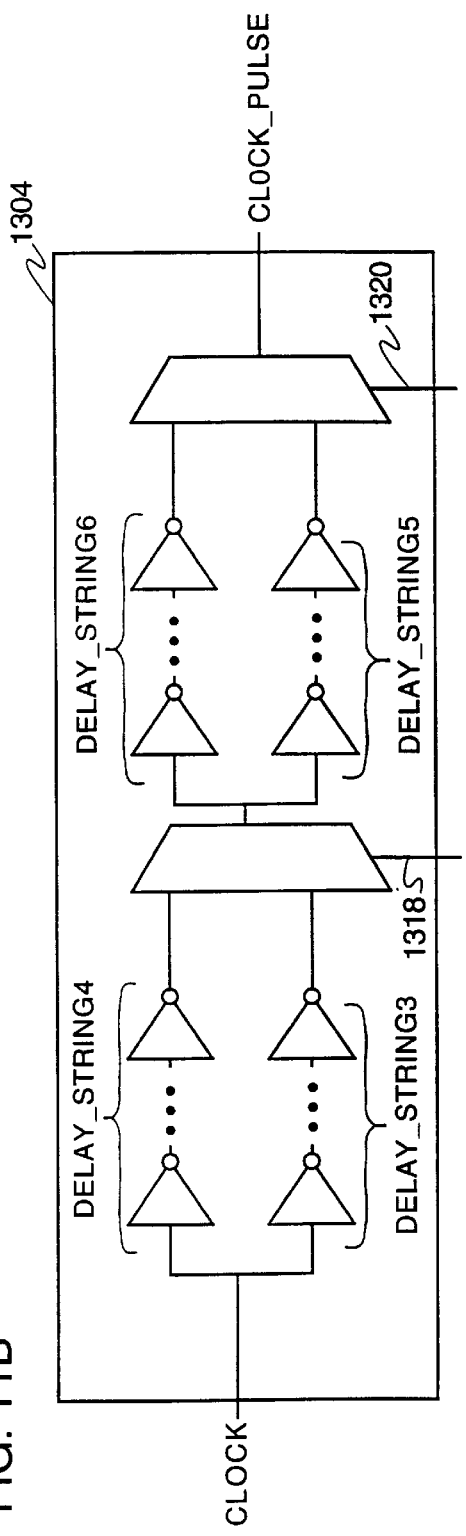

FIG. 11B shows another example of a CDM 1204, identified as CIRCUIT 1304, which uses non-current starved elements to adjust Wclk. Circuit 1304 uses a series of inverters and multiplexors as delay elements. The desired delay is achieved by choosing the total number of delay elements through which the CLOCK pulse passes. DELAY_STRING3–DELAY_STRING6, each represents a string of delay elements. The number of elements in DELAY_STRING4 and DELAY_STRING6 are different, respectively, from the number of elements in DELAY_STRING3 and DELAY_STRING5. The number of elements in each of DELAY_STRING3–DELAY_STRING6 is selected according to the CLOCK_PULSE width required. Control inputs to multiplexors, 1318,1320, allow different combinations of DELAY_STRING3–6 to be selected. The control inputs may be derived from the delay controls provided to a DM 770 by calibration circuit 520, or, they may be derived from other control circuitry. Because the circuit elements of 1304 do not employ current starvation, they do not suffer from the bandwidth limitations described above (that is, a CDM 1204 using a DM 770 circuit topology), and can therefore be used where the CLOCK may contain narrow pulses. Since the total delays in CIRCUIT 1304 are created by including or excluding inverters or multiplexors, the result is a limited delay granularity in comparison to the more finely tunable delay of the example described above which uses a circuit topology similar to DM 770.

Figure 12:
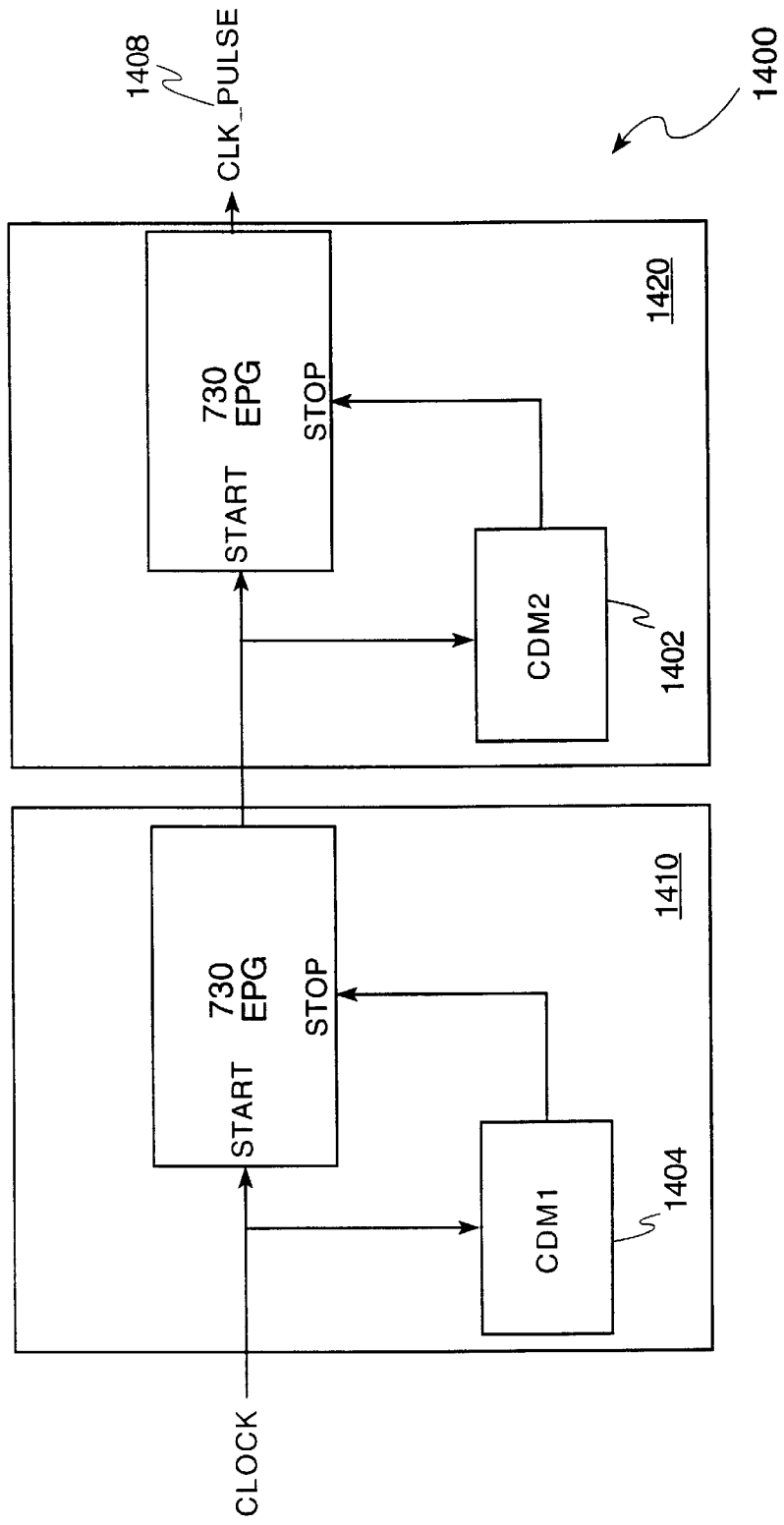
FIG. 12 is a block diagram of a clock reshaping circuit.

FIG. 12 shows an example of a two-stage clock circuit 1400 which includes two clock circuits, 1410 and 1420, connected in series. CDM1 1404, included in clock circuit 1410, is made with non-current-starved elements such as in CDM examples 1302 or 1304. CDM2 1402, included in clock circuit 1420, is made with current starved elements using a circuit topology similar to DM 770. Clock circuit 1410 coarsely widens any narrow pulses in CLOCK for use by clock circuit 1420. Clock circuit 1420 finely controls the width of CLK_PULSE 1408 from the reshaped output of clock circuit 1410.

Other embodiments are within the scope of the following claims.

What is claimed is:

1. An apparatus comprising
   means for generating a series of first clock pulses, including
      means for receiving input clock pulses, and
      means for delivering the first clock pulses to a clock re-shaping circuit, and
   means for generating a series of new clock pulses, including
      means for receiving first clock pulses, and
      means for delivering the new clock pulses to a target circuit that uses the new clock pulses to determine at least a start time or a stop time of a signal generated by the target circuit, and
   a means for governing the width of the new clock pulses, the means including a circuit that produces longer delays for faster corners.

2. An apparatus comprising:
   a clock generator to generate a series of new clock pulses, the clock generator having
      an input port to receive input clock pulses,
      an output port to deliver the new clock pulses to a target circuit that generates modulated data pulses having start and stop times based on the new clock pulses, and
      a pulse delay to govern a width of the new clock pulses, the pulse delay including a circuit to adjust the width to compensate for variations in process, voltage and temperature.

3. The apparatus of claim 2 in which the clock generator terminates a new clock pulse in response to the pulse delay generating a terminating signal.

4. The apparatus of claim 2 in which the target circuit includes a delay circuit that is bandwidth limited.

5. The apparatus of claim 4 in which the delay circuit comprises current starved inverters and the pulse delay comprises current starved inverters sized differently from the current starved inverters of the delay circuit.

6. The apparatus of claim 5 in which control signals are input to the delay circuit to control the current starved inverters.

7. The apparatus of claim 4 in which the delay circuit comprises current starved inverters and the pulse delay comprises a network of multiplexers and inverters connected to enable selectable amounts of delay to be imposed by the inverters and multiplexers over a range of delays, by controlling the multiplexers.

8. The apparatus of claim 7 in which control signals are input to the pulse delay to control non-current starved inverters.

9. An apparatus comprising:
   a first clock generator to generate a series of first clock pulses, the clock generator having
      an input port to receive input clock pulses,
      a first delay circuit to control the width of the first clock pulses,
      an output port to deliver the first clock pulses to a second clock generator, the second clock generator to generate a series of new clock pulses, the second clock generator having
         an input port to receive first clock pulses,
         a second delay circuit to govern the width of the new clock pulses, and
         an output port to provide the new clock pulses to a target circuit that uses the new clock pulses to determine at least a start time or a stop time of a signal generated by the target circuit.

10. The apparatus of claim 9 in which the first delay circuit imposes a delay that is selectable with a first degree of granularity over a first range and the second delay circuit imposes a delay that is selectable with a second, different degree of granularity over a second range.

11. The apparatus of claim 9 in which the first delay circuit comprises non-current starved elements and the second delay circuit comprises current starved inverters.

12. The apparatus of claim 11 in which the target circuit generates modulated data pulses having start and stop times based on the new clock pulses.

13. The apparatus of claim 12 in which the target circuit includes a delay circuit that is bandwidth limited.

14. The apparatus of claim 13 in which the delay circuit comprises current starved inverters.

15. A method comprising:
   generating a series of new clock pulses based on input clock pulses, the new clock pulses being reshaped in a manner that produces wider pulse widths for faster corners,
   using the new clock pulses to determine at least a start time or a stop time of a modulated signal to be generated by a target circuit,
   detecting the input clock pulse, and
   adjusting a delay responsive to variations in process, voltage and temperature.

16. The method of claim 15 wherein generating a series of new clock pulses further comprises:
   detecting input clock pulses, and
   determining a width of new clock pulses with the width adjusted to compensate for variations in process, voltage and temperature.

17. The method of claim 16 wherein the delay is slower for faster corners.

18. The method of claim 16 wherein the delay is faster for slower corners.

19. The method of claim 16 in which the new clock pulses are used in a delay circuit that is bandwidth limited.

20. The method of claim 19 in which the start time or stop time is modulated by current starved inverters.

21. An apparatus comprising
   means for generating a series of new clock pulses, including
      means for receiving input clock pulses, and
      means for delivering the new clock pulses to a target circuit that uses the new clock pulses to determine at least a start time or a stop time of a modulated signal generated by the target circuit, and
      a means for governing the width of the new clock pulses, the means including a circuit that produces longer delays for faster corners.

22. A method comprising:
   generating a series of first clock pulses based on input clock pulses,
   generating a series of new clock pulses based on first clock pulses, the new clock pulses being reshaped in a manner that produces wider pulse widths for faster corners,
   detecting a first clock pulse,
   adjusting a delay responsive to variations in process, voltage and temperature, and
   using the new clock pulse to determine at least a start time or a stop time of a signal to be generated by a target circuit.

23. The method of claim 22 wherein generating a series of new clock pulses based on first clock pulses further comprises:
   detecting first clock pulses, and
   determining a width of new clock pulses with the width adjusted to compensate for variations in process, voltage and temperature.

24. The method of claim 23 wherein the delay is slower for faster corners.

25. The method of claim 23 wherein the delay is faster for slower corners.

26. The method of claim 23 in which the new clock pulses are used in modulating start and stop times of data pulses.

27. The method of claim 26 in which the new clock pulses are used in a delay circuit that is bandwidth limited.

28. The method of claim 27 in which the start time or stop time is modulated by current starved inverters.

29. The method of claim 23 wherein generating a series of first clock pulses based on input clock pulses further comprises:
   reshaping the input clock pulses using a circuit which includes non-current starved elements.

30. The method of claim 23 wherein generating a series of new clock pulses based on first clock pulses, the new clock pulses being reshaped in a manner that produces wider pulse widths for faster corners further comprises:
   reshaping the first clock pulses using a circuit which includes current starved elements.

31. An apparatus comprising:
   a clock generator to generate a series of new clock pulses, the clock generator having
      an input port to receive input clock pulses,
      an output port to deliver the new clock pulses to a target circuit that uses the new clock pulses to determine at least a start time or a stop time of a signal generated by the target circuit, the target circuit including a delay circuit that comprises current starved inverters, and
      a pulse delay to govern a width of the new clock pulses, the pulse delay including a circuit to adjust the width to compensate for variations in process, voltage and temperature.

32. The apparatus of claim 31 in which the target circuit generates modulated data pulses having start and stop times based on the new clock pulses.

33. The apparatus of claim 31 in which the clock generator terminates a new clock pulse in response to the pulse delay generating a terminating signal.

34. The apparatus of claim 31 in which the pulse delay comprises current starved inverters sized differently from the current starved inverters of the delay circuit.

35. The apparatus of claim 34 in which control signals are input to the delay circuit to control the current starved inverters.

* * * * *